(12) United States Patent
Yang et al.

(10) Patent No.: US 7,339,139 B2
(45) Date of Patent: Mar. 4, 2008

(54) MULTI-LAYERED RADIANT THERMAL EVAPORATOR AND METHOD OF USE

(75) Inventors: Yimou Yang, Windsor, CT (US);
Kenneth Martin, Suffield, CT (US);
Stanley J. Misunas, Suffield, CT (US);
Song Tao, West Hartford, CT (US);
David Morganson, Stafford Springs, CT (US)

(73) Assignee: Darly Custom Technology, Inc., Bloomfield, CT (US)

( * ) Notice: Subject to any disclaimer, the term of this patent is extended or adjusted under 35 U.S.C. 154(b) by 463 days.

(21) Appl. No.: 10/678,811

(22) Filed: Oct. 3, 2003

(65) Prior Publication Data
US 2005/0072361 A1    Apr. 7, 2005

(51) Int. Cl.
*H05B 3/30*     (2006.01)
*F27B 14/04*    (2006.01)
*F27B 14/06*    (2006.01)
*F27B 14/14*    (2006.01)
*C23C 14/26*    (2006.01)
*C23C 14/56*    (2006.01)

(52) U.S. Cl. ............ 219/426; 392/389; 118/726; 118/727; 427/248.1

(58) Field of Classification Search ............ None
See application file for complete search history.

(56) References Cited

U.S. PATENT DOCUMENTS

| | | | |
|---|---|---|---|
| 2,640,861 A * | 6/1953 | Kremers | 219/426 |
| 4,552,092 A * | 11/1985 | Yanagi et al. | 118/726 |
| 4,748,313 A | 5/1988 | de Rudnay | |
| 5,031,229 A * | 7/1991 | Chow | 392/389 |
| 5,182,567 A | 1/1993 | Wilder | |
| 5,239,611 A | 8/1993 | Weinert | |
| 6,367,414 B2 | 4/2002 | Witzman et al. | |
| 6,849,832 B2 * | 2/2005 | Endo et al. | 219/426 |

FOREIGN PATENT DOCUMENTS

| | | |
|---|---|---|
| DE | 1621306 | 4/1971 |
| EP | 652303 | 9/1997 |

\* cited by examiner

*Primary Examiner*—J. Pelham
(74) *Attorney, Agent, or Firm*—McCormick, Paulding & Huber LLP

(57) ABSTRACT

The present invention provides a system and method for uniform coating of a substrate at high deposition rates by evaporating a coating material in a vacuum chamber. The system includes an evaporator having a heating crucible for containing a coating material to be evaporated and a generally planar heat source disposed so as to heat a surface of a coating material contained in the heating crucible. Preferably, the heat source is manufactured from a ceramic or intermetallic material and includes a first layer defining a first set of openings and a second layer defining a second set of openings wherein the second layer overlies the first layer and is spaced apart therefrom. The first and second sets of openings allow the evaporated coating material to pass therethrough for dispersion of the coating material in a deposition zone defined by a containment shield disposed above the heat source.

16 Claims, 15 Drawing Sheets

Section A-A

Section A-A

Section B-B

Section A-A

Section B-B

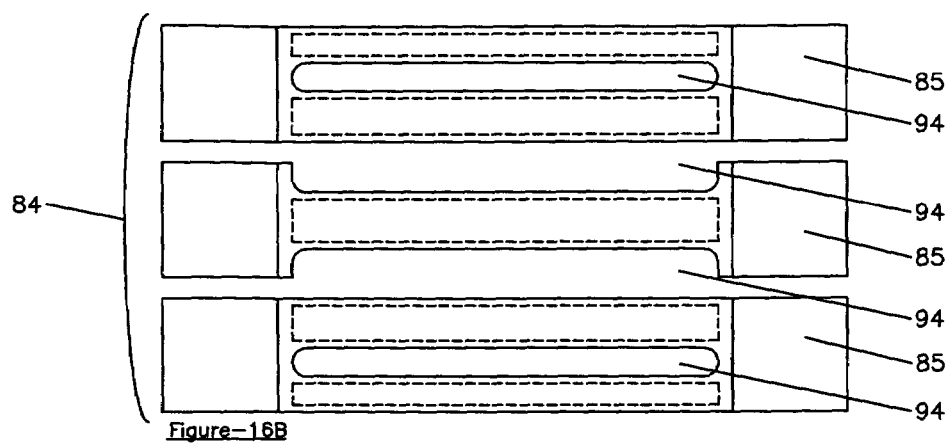
Figure—16B
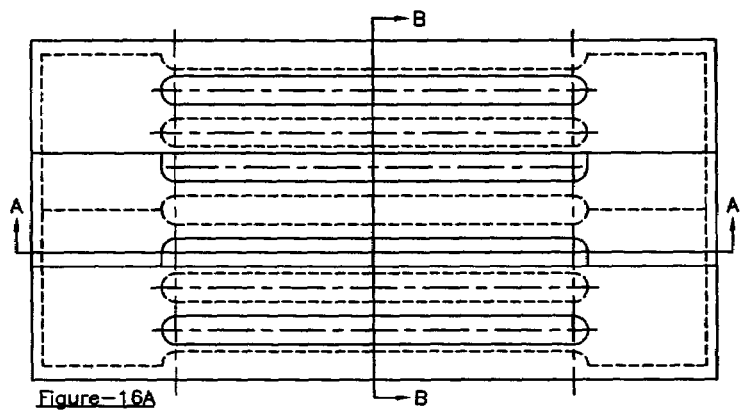
Figure—16A
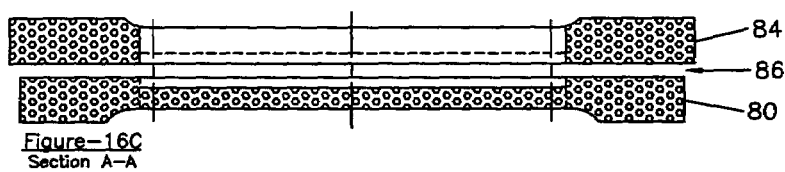
Figure—16C
Section A-A
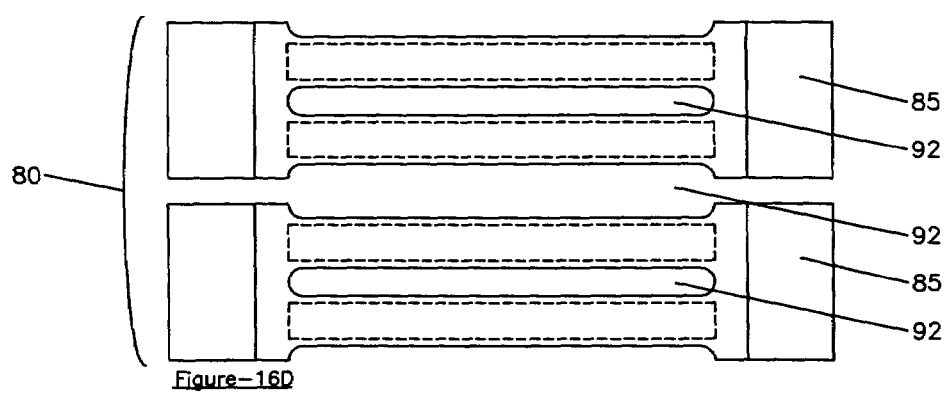
Figure—16D
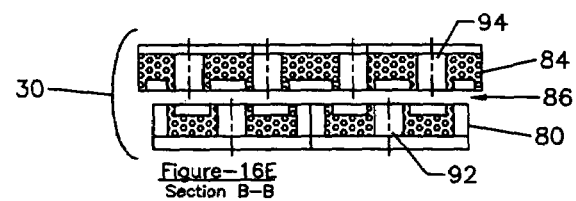
Figure—16E
Section B-B

MULTI-LAYERED RADIANT THERMAL EVAPORATOR AND METHOD OF USE

FIELD OF THE INVENTION

The present invention generally relates to thermal sublimation processes and equipment and more particularly to a system and method for applying a coating to a substrate including an evaporator having a heat source disposed above a crucible containing a coating material wherein the heat source includes a ceramic or intermetallic material.

BACKGROUND OF THE INVENTION

Thermal sublimation and deposition of materials on a substrate in a vacuum is known and in increased demand especially for deposition of materials having high melting temperatures on continuous webs. Several prior art techniques are commonly used for thermal evaporation of coating materials wherein a coating material is heated to a melting temperature within a vacuum chamber creating a vapor and the vapor condenses on a cooler substrate forming a coating on the substrate. Prior art thermal evaporation systems include aluminum wire feed systems, induction heaters and heating systems having electron beam sources.

Aluminum wire feed systems normally include a spool of metal wire being continuously fed onto an electrically resistive boat which is heated. The wire coating material contacts the boat and evaporates from a solid to a vapor. The vapor then condenses onto a substrate. Wire feed thermal evaporation systems are efficient and operate at relatively high line speeds with high deposition rates and long run times, however, are generally limited to one type of a source material.

Induction heater systems normally include an open crucible containing a coating material wherein the coating material is heated indirectly by heating the crucible. The material is slowly heated usually from a solid to a liquid and finally to a temperature at which point the coating material is vaporized. The vaporized coating material is then dispersed and collected onto a substrate forming a coating thereon. One major drawback of this type of system is that the entire quantity of the coating material in the crucible must be heated to a boiling temperature before the coating process can begin. Also, an evaporation process is often limited by the capacity of the crucible. Accordingly, major drawbacks of many induction heater systems include long heat-up and cool-down times and limited material supplies causing reduced deposition rates, line speeds and overall throughput of a coating process.

Additionally, induction heating systems wherein a coating material is heated from the sides or bottom of a crucible can have a tendency to blow out vapor from the interior of the crucible causing undesirable splashing or splattering at the surface of the coating material in the crucible.

Heating systems having electron beam sources normally provide direct heat to a coating material contained in a crucible by focusing a high current electron beam on the surface of the coating material and scanning the beam over the surface thereof in order to uniformly heat the coating material in the crucible. The comparatively high cost of this type of electron beam system drastically limits its usefulness in the economical production of coated materials.

Additionally, many prior art thermal heating elements are made from expensive metals such as molybdenum, tungsten or tantalum which can be easily corroded or damaged by contacting coating materials and/or reaction gases like nitrogen and oxygen which may be added to a coating process for forming an oxide or nitride film on a substrate or for assisting the reaction process. If the material of a heating element reacts with evaporated coating material or a reaction gas, a build-up of corrosion or other materials can close or partially block openings in the heating element which can prevent a coating material from passing through the heating element inhibiting the coating process.

Based on the foregoing, it is the general object of the present invention to provide a multi-layered radiant thermal evaporator that improves upon, or overcomes the problems and drawbacks associated with the prior art.

SUMMARY OF THE INVENTION

The present invention provides a system and method for uniform coating of a substrate at high deposition rates by evaporating a coating material in a vacuum chamber. The system can be used with coating materials having high melting points and wherein the substrates are large-scale continuous webs moving at fast line speeds. The present invention is especially useful with currently popular coating materials such as Zinc Sulfate (ZnS) or Silicon Oxides (SiOx).

The system of the present invention includes an evaporator having a heating crucible for containing a coating material to be evaporated and a generally planar heat source disposed so as to heat a surface of a coating material contained in the heating crucible. Preferably, the heat source includes a first layer defining a first set of openings and a second layer defining a second set of openings wherein the second layer overlies the first layer and is spaced apart therefrom. The first and second sets of openings allow the evaporated coating material to pass therethrough for dispersion of the coating material in a deposition zone defined by a containment shield disposed above the heat source The system includes a process roll for supporting a substrate to be coated in the deposition zone. A vacuum chamber is provided wherein the heating crucible, the heat source and the deposition zone are disposed within the vacuum chamber for evaporation of the coating material in a vacuum.

The heat source of the present invention is generally planar and formed from a ceramic or intermetallic material having a constant electrical resistance and having opposing ends that are connectable to a power supply for supplying electrical power through the heat source for heating the heat source.

Preferably, the heat source includes a material selected from the group consisting of graphite, aluminum oxide, aluminum nitride, boron nitride and titanium diboride and includes a first layer defining a first set of openings and a second layer defining a second set of openings. The first layer being spaced apart from the second layer and wherein the first set of openings and the second set of openings are out of alignment with respect to each other for causing deflections in the path of molecules of the evaporated coating material passing through the heat source and increasing the kinetic energy thereof. Because each of the first and second layer of the heat source are heated, the molecules of evaporated coating material are excited throughout the movement thereof through the heat source facilitating a complete evaporation of the coating material exiting through the second layer of the heat source. The space between the first and second layers of the heat source defines a ricochet zone wherein many of the deflections in the paths of the molecules of evaporated coating material occur. In one embodiment of the present invention, the first layer of the heat source is formed integral with the second layer.

In another aspect of the present invention a material delivery system is provided for maintaining a constant distance between a surface of a coating material in the crucible and the heat source. The material delivery system can include a heating crucible having a movable sidewall wherein the sidewall is movable during an evaporation process for varying the capacity of the heating crucible and maintaining a constant distance between the surface of the coating material being evaporated and the heat source. A driver can be coupled to the movable sidewall for moving the sidewall of the crucible.

Additionally, the system includes a controller coupled to various components of the system for controlling and/or monitoring the quality and performance of the system, an evaporation process or a coated substrate.

In another embodiment of the present invention, the heat source includes one or more baffle plates positioned between the first layer and the second layer of the heat source, the baffle plate defining a set of openings wherein the openings in the baffle plate are out of alignment with at least one of the first set of openings and the second set of openings for further deflecting of the coating material passing through the heat source.

The present invention also provides a method of evaporating a coating material for coating a substrate in a high vacuum environment. The method includes the steps of depositing a quantity of coating material to be evaporated in a heating crucible; placing a heat source above a surface of the coating material in the crucible for vaporizing the coating material at the surface; heating the surface of the quantity of coating material to a predetermined temperature for evaporating the coating material at the surface; confining the vaporized coating material in a deposition zone; moving a substrate through the deposition zone for coating the substrate with the evaporated coating material from the crucible; and enveloping the heating crucible, the heat source and the deposition zone in a vacuum chamber for evaporating and depositing the coating material on a substrate in a vacuum.

Additionally, the method of the invention can include a step of maintaining an approximately constant distance between a surface of a heat source and the surface of the coating material in the crucible during the step of heating for consistency in the evaporation thereof.

One advantage of the system and method of the present invention is that it provides for the efficient coatings of substrates including both continuous webs and discrete articles in a cost-effective manner that provides uniform coatings of large-scale applications with high deposition rates that can be used with various coating materials including those with high-melting points.

Another advantage of the present invention is the heat source is manufactured from a ceramic or intermetallic material that provides a reliable and constant heat source that is non-corrosive with most coating materials and/or reaction gases resulting in high quality usefulness over a long period.

Another advantage of the evaporator of the present invention is that it provides heat at a constant temperature and a constant distance from the surface of a coating material in a crucible throughout the duration of an evaporation process thereby providing uniform coatings over an entire substrate.

Other objects and advantages of the present invention will become apparent from the following description taken in connection with the accompanying drawings, wherein, by way of illustration and example, various embodiments of the invention are disclosed.

BRIEF DESCRIPTION OF THE DRAWINGS

FIG. 5 is a side elevational, partly in section schematic view of the evaporator of FIG. 1 shown in a system according to the present invention for batch coating.

FIG. 16A is a top view of a heat source according to the present invention showing a second layer of the heat source overlying a first layer thereof wherein the first and second layers are formed from multiple segments positioned adjacent to one another.

FIG. 16B is an exploded top view of the second layer of the heat source of FIG. 16A.

FIG. 16C is a cross-sectional view of the heat source of FIG. 16A taken at the line A-A.

FIG. 16D is an exploded bottom view of the first layer of the heat source of FIG. 16A.

FIG. 16E is a cross-sectional view of the heat source of FIG. 16A taken at the line B-B.

DETAILED DESCRIPTION OF THE INVENTION

Figure 1:
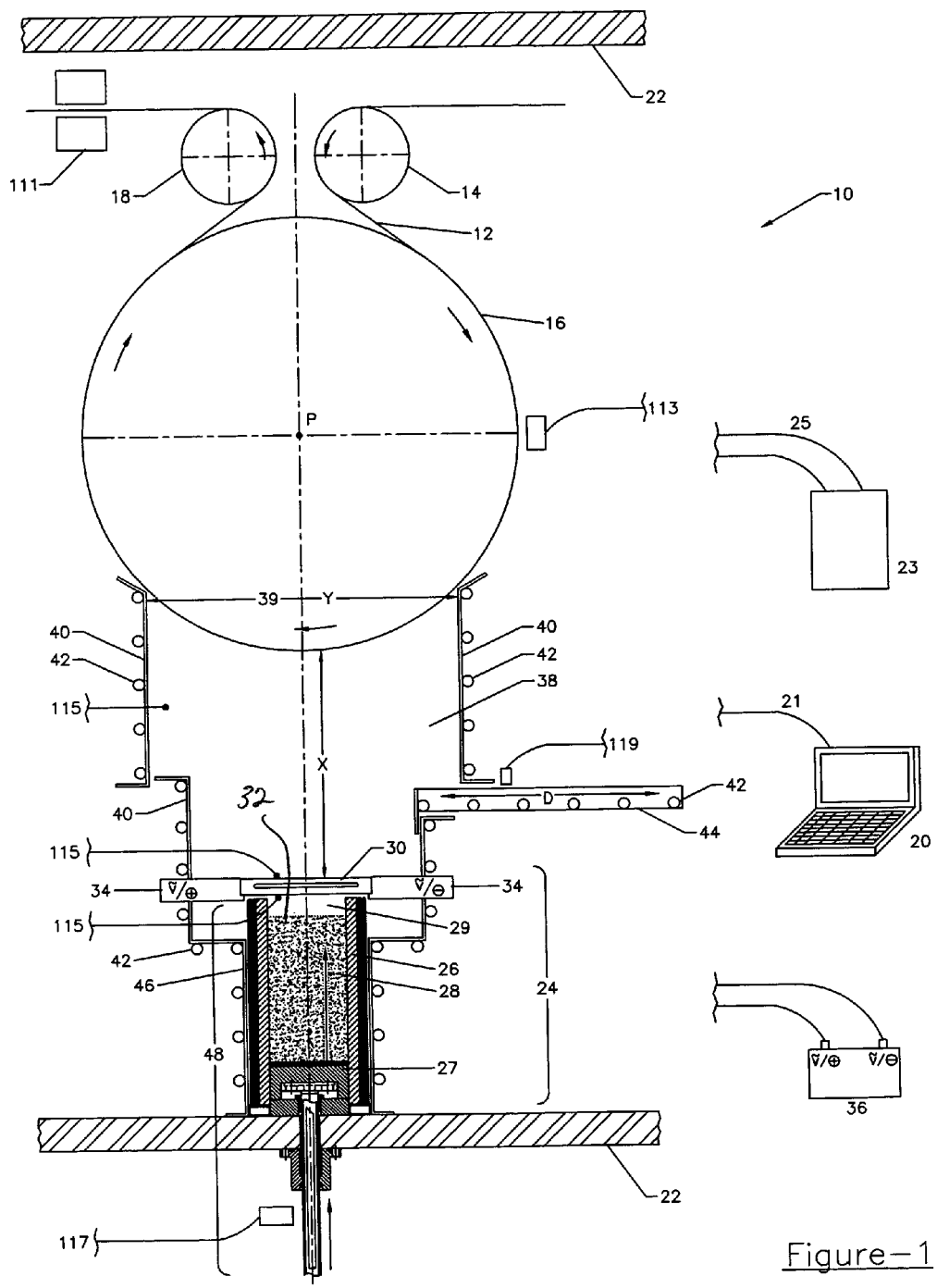
FIG. 1 is a side elevational, partly in section schematic view of a system for coating a substrate according to the present invention and an evaporator thereof.

Following is a detailed description of the embodiments of the present invention that are illustrated in the drawings wherein like structures are identified with like reference designations.

As shown in FIG. 1, the present invention is directed to a system generally designated by the reference numeral 10, for coating a substrate by evaporating or sublimating a coating material in a vacuum. In the FIG. 1 embodiment, a substrate 12 to be coated is a semi-continuous or continuous web carried on a feeder roll 14, a process roll 16 and a take-up roll 18. At least one of the feeder roll 14, process roll 16 and take-up roll 18 are coupled to a drive mechanism (not shown) for controlling the movement of the substrate 12. The drive mechanism or substrate driver may be coupled to a controller 20 for controlling the rotational velocity or a line speed of the process roll 16. In operation, the line speed of the process roll can be in excess of 120 feet per minute depending on the application. In the FIG. 1 embodiment, the controller 20 is a computer that is coupled to various components or sensors of the system 10 via communication lines 21 for controlling an evaporation process or evaluating the performance of the system, the evaporation process, or the coating.

The system 10 includes a vacuum chamber 22 that contains a high vacuum environment for an evaporation process. A vacuum pump 23 for generating high vacuum is connected to the vacuum chamber 22 by a vacuum line 25. In the FIG. 1 embodiment, a transport system for the substrate 12 including the feeder roll 14, process roll 16 and take-up roll 18 are contained within the vacuum chamber 22. In other embodiments of the invention, a portion of a transport system for the substrate 12 may be disposed outside of the vacuum chamber 22.

The system 10 includes an evaporator designated generally by the reference numeral 24 disposed below the substrate 12. The evaporator 24 includes a crucible 26 shown mounted to an inner wall of the vacuum chamber 22. The crucible 26 contains a quantity of coating material 28 to be heated and evaporated for coating the substrate 12. A heat source 30 is mounted above the crucible 26 and a surface 32 of the coating material 28 for heating the quantity of coating material 28 at the surface thereof. A pair of source clamp blocks 34 support the heat source 30 at opposing ends of the heat source and provide electrical connection of each end of the heat source to a power supply 36. The clamp blocks 34 are typically arm-chair or end-clamp style clamp blocks that are well known in the art.

A deposition zone 38 is defined by one or more containment shields 40 that are disposed between the heat source 30 and the substrate 12 for confining the vaporized coating material 28 in the deposition zone. The containment shields 40 can be variable in size to adjust the distance X between the substrate 12 and the heat source 30. A greater distance X between the heat source 30 and the substrate 12 reduces the potential for heat damage to the substrate as well as ensures a greater uniformity in the coating applied thereto. Typically the distance X between the heat source 30 and the substrate is approximately 250 mm or greater and can be adjusted to be greater or less depending on the coating material 28, the material of the substrate 12, and the specifications of the coating. The size of the deposition zone 38 in the direction of the axis P of the process roll 16 is typically approximately equal to a width of the substrate 12, however, the width of the deposition zone in the direction of the P axis can be greater or less than the width of the substrate, depending on the application.

In preferred embodiments of the present invention, the deposition zone 38 has a wide aperture 39 in a direction labeled "Y" that is transverse to the axis P of the process roll 16. This allows the substrate to remain in the deposition zone 38 for a maximum period of time and provides for heavier coatings at higher line speeds. Typically the aperture 39 in the Y direction is less than the diameter of the process roll 16. The aperture 39 in the deposition zone 38 may be adjustable for varying the size of the aperture depending on the size and type of the substrate 12 or the desired coating to be adhered thereto.

The containment shields 40 include cooling lines 42 for cooling or heating the deposition zone 38 depending on the requirements of the evaporation process and the materials used. In some embodiments of the system 10, two or more of the evaporators 24 are positioned adjacent one another in the Y direction or in the direction of the P axis to provide a sufficient amount of evaporated coating material 28 in the deposition zone for large substrates 12. Alternatively, the crucible 26 can be elongated wherein a single crucible can be used for coating large substrates 12. For example, an elongated crucible 26 having a length approximately the width of a substrate 12 can be positioned to apply a coating to the entire substrate.

Still referring to FIG. 1, a shutter mechanism 44 is coupled to the containment shields 40 for movement in the direction of the line D for removably positioning the shutter mechanism between the heat source 30 and the substrate 12. In the FIG. 1 embodiment, the shutter mechanism includes cooling lines 42 for cooling or heating the shutter mechanism. The shutter mechanism 42 can be used to protect the substrate from heat damage during start-up and shut-down procedures of an evaporation process or when the heat source is being heated to an operating temperature or cooled. The shutter mechanism can include a drive mechanism for opening and closing the shutter mechanism (not shown) which is coupled to and controlled by the controller 20.

Figure 2:
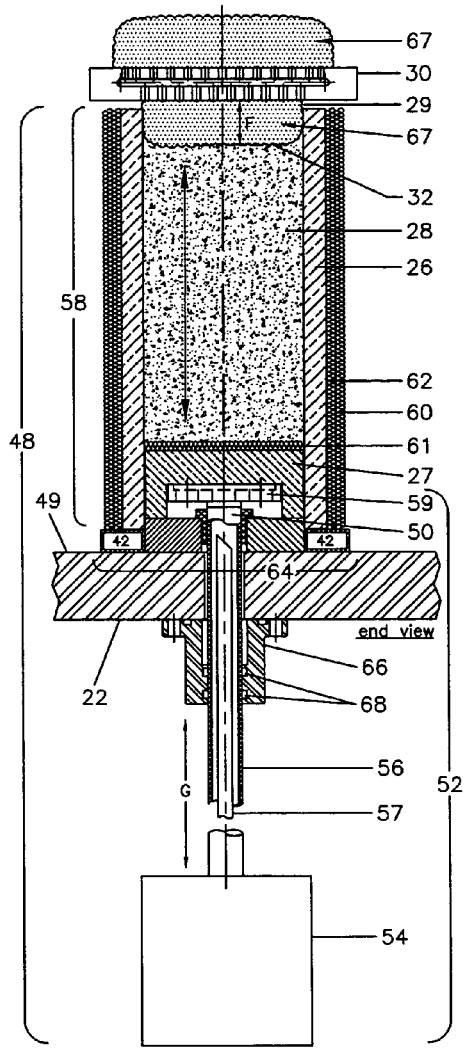
FIG. 2 is a side elevational cross-sectional view of a crucible and heat source of an evaporator according to the present invention.
Figure 3:
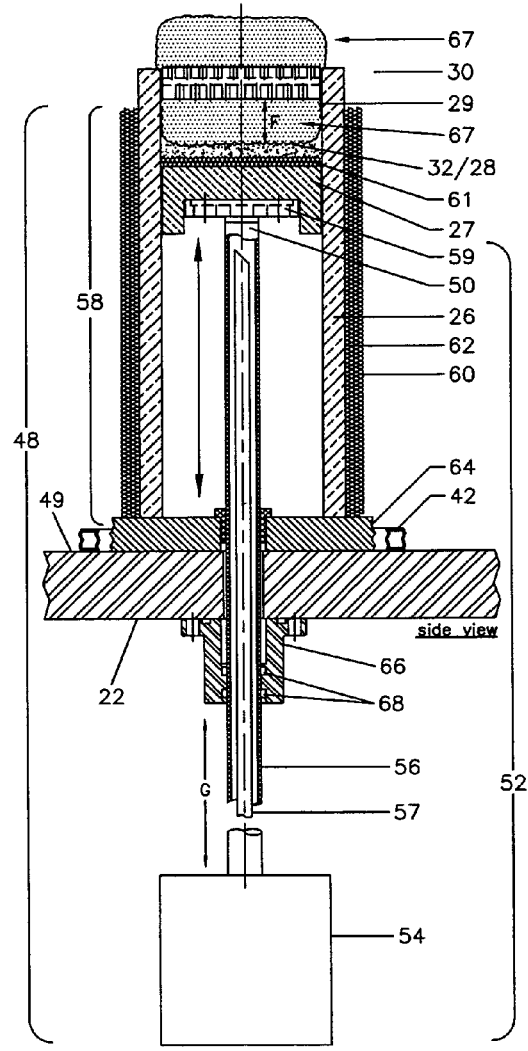
FIG. 3 is a side elevational cross-sectional view of another embodiment of a crucible and heat source of an evaporator according to the present invention.

Referring to FIGS. 1-3, the crucible 26 is a heating crucible wherein a quantity of coating material 28 contained in the crucible is heated to a temperature sufficient to evaporate the coating material at least at the surface thereof. Cooling shields 46 having cooling lines 42 coupled to an outer surface thereof are disposed adjacent to the sidewalls of the crucible 26. The cooling lines 42 can be used to transport coolant adjacent the shields 46 to reduce heat transmission from the crucible 26 to other equipment during an evaporation process or to reduce the time required for cooling the crucible at the end of an evaporation process. A coolant moved through the cooling lines 42 can also be used to reduce the temperature of the crucible following an evaporation process so that the time necessary to replenish a supply of the coating material 28 in the crucible is reduced.

A material delivery system 48, shown in FIG. 1, includes a driver for moving the coating material 28 towards the opening 29 in the crucible during an evaporation process. The material delivery system 48 can be used for maintaining a constant distance F (shown in FIG. 2) between the surface 32 of the coating material 28 and the heat source 30. The material delivery system 48 includes the crucible 26 mounted on an inner surface 49 of the vacuum chamber 22. The crucible 26 has a moveable sidewall 27 coupled to a free end 50 of a variable length cylinder 52. The cylinder 52 includes a fixed portion 54 and a moveable portion 56 wherein the moveable portion is slideable in the direction of the line G into and out of the fixed portion 54 for varying the overall length of the cylinder 52 along an axis thereof. A piston 59 is attached to the free end 50 and abuts the moveable sidewall 27 for moving the coating material 28 towards the opening 29 in the crucible 26. A seal 61 is provided to retain the coating material 28 in the crucible 26. A cooling line 57 is disposed in the moveable portion 56 of the variable length cylinder 52 for carrying coolant and reducing the temperature of the variable length cylinder 52 and preventing expansion and deformation thereof due to excessive heat. The cooling line 57 also prevents thermal damage to the seals interior or exterior of the cylinder 52. The variable length cylinder 52 can be powered electrically, hydraulically or pneumatically. In one embodiment of the present invention, the variable length cylinder 52 is powered electrically using a motor coupled to the cylinder wherein the motor is also coupled to the controller 20 for controlling the length of the cylinder in accordance with the evaporation rate of the coating material 28. Although, the material delivery system 48 shown in FIGS. 1-3 includes a driver which includes the variable length cylinder 52, the present invention is not limited in this regard as other types of known drivers could be used to vary the capacity of the crucible 26 during an evaporation process or otherwise maintain a constant distance F between the surface of the coating material 28 contained in the crucible and the heat source 30.

Referring to FIGS. 2 and 3, the crucible 26 has a variable capacity reservoir 58 as described above. The crucible 26 of FIGS. 2 and 3 is square however, a crucible having another shape such as round or rectangular would suffice and not depart from the scope of the present invention. Typically, the crucible 26 as well as the piston 59 and piston seal 61 are manufactured from magnesium oxide, graphite, aluminum oxide, boron nitrate or another refractory type material that can withstand temperatures of 2000° Celsius without warping, cracking or undergoing excessive expansion. Thermal insulation 60 is provided adjacent the outer walls 62 of the crucible 26 to contain heat within the crucible. The insulation 60 can be manufactured from ceramic materials, graphite wool or other materials with a high R-value and capable of withstanding temperatures in excess of 2000° Celsius.

The crucible 26 is positioned on a cooled alignment rail 64. The alignment rail 64 is used to position one or more crucibles 26 in the deposition zone 38 to ensure alignment between the crucibles 26 including the movable sidewalls 27 thereof and the variable length cylinder 52. In a system 10 having two or more evaporators 24, the spacing therebetween is important in obtaining an even and uniform coating especially in overlapping dispersion patterns. In batch coating, one or more alignment rails 64 may be used to establish a grid arrangement for aligning multiple evaporators 24. The alignment rail 64 also reduces heat transmission to other components of the system 10 and ensures proper alignment between the free end 50 of the variable length cylinder 52 and the moveable sidewall 27 of the crucible 26. A vacuum to atmosphere feed through flange 66 mounted to the exterior of the vacuum chamber 22 provides axial support for the moveable portion 56 of the variable length cylinder 52 and includes seals 68 for maintaining the high vacuum in the vacuum chamber 22.

Still referring to FIGS. 2 and 3, the heat source 30 generates a radiant heat zone 67 adjacent the heat source for heating the coating material 28 at the surface 32 thereof. Depending on the type of coating material 28, the space between the surface 32 of the coating material and the heat source 30 and other factors, the operating temperature of the heat source is adjusted accordingly. The distance F that is maintained between the surface 32 of the coating material 28 and the heat source 30 ensures that the coating material does not directly contact the heat source. This allows undisturbed sublimation of the coating material 28 and reduces the erosion of the heat source 30 that is commonly caused in prior art systems where there is direct contact between the heat source and the coating material being heated. Additionally, the heat source 30 being spaced from the coating material 28 and heating the surface 32 thereof with indirect heat thereby reduces the occurrence of undesirable boiling, spitting, splattering or splashing of non-evaporated particles of the coating material.

Figure 4:
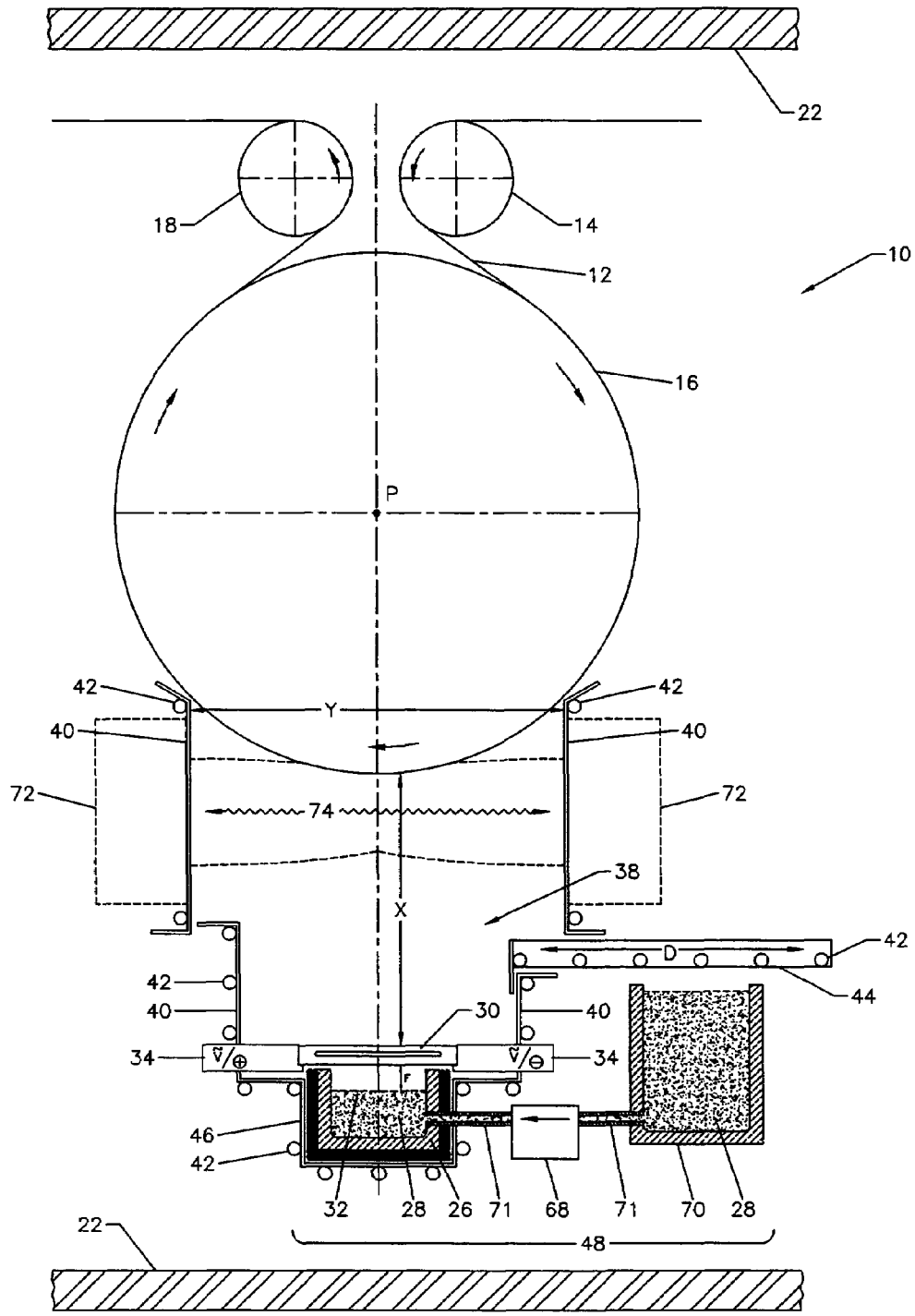
FIG. 4 is a side elevational, partly in section schematic view of a system for coating a substrate according to the present invention including an embodiment of an evaporator thereof.

FIG. 4 illustrates another embodiment of the system 10 of the present invention including a material delivery system 48 wherein the crucible 26 is in fluid communication with a material transfer device 68 and an auxiliary crucible 70 via material transport lines 71. Depending on the initial state of the coating material 28, the material transfer device 68 can be any suitable device for the transfer of the coating material between the auxiliary crucible 70 and the crucible 26. For example, the material transfer device 68 can include a pump for the transfer of liquids. Alternatively, the material transfer device 68 can include an auger, gear, a gravity feed system, or any other suitable devices for the transfer of the coating material 28. Typically, the coating material 28 is initially granular, powder, pellets, ingots, slugs, wire, liquid or another form. Depending on the initial form of the coating material 28, the crucible 26, the material transfer device 68 and the auxiliary crucible 70 are arranged to replenish the quantity of coating material 28 in the crucible 26 so that a constant distance F is maintained between the surface 32 of the coating material and the heat source 30 during an evaporation process.

FIG. 4 shows an embodiment of the system 10 of the present invention having a plasma generator 72 coupled to the containment shields 40 for generating a reactive plasma 74 and introducing the plasma 74 into the deposition zone 38 for supplementing the coating material 28 therewith. The plasma generator 72 can utilize various apparatus for generating the plasma 74 including cathodes, microwaves, ion sources or a glow discharge system.

Figure 5:
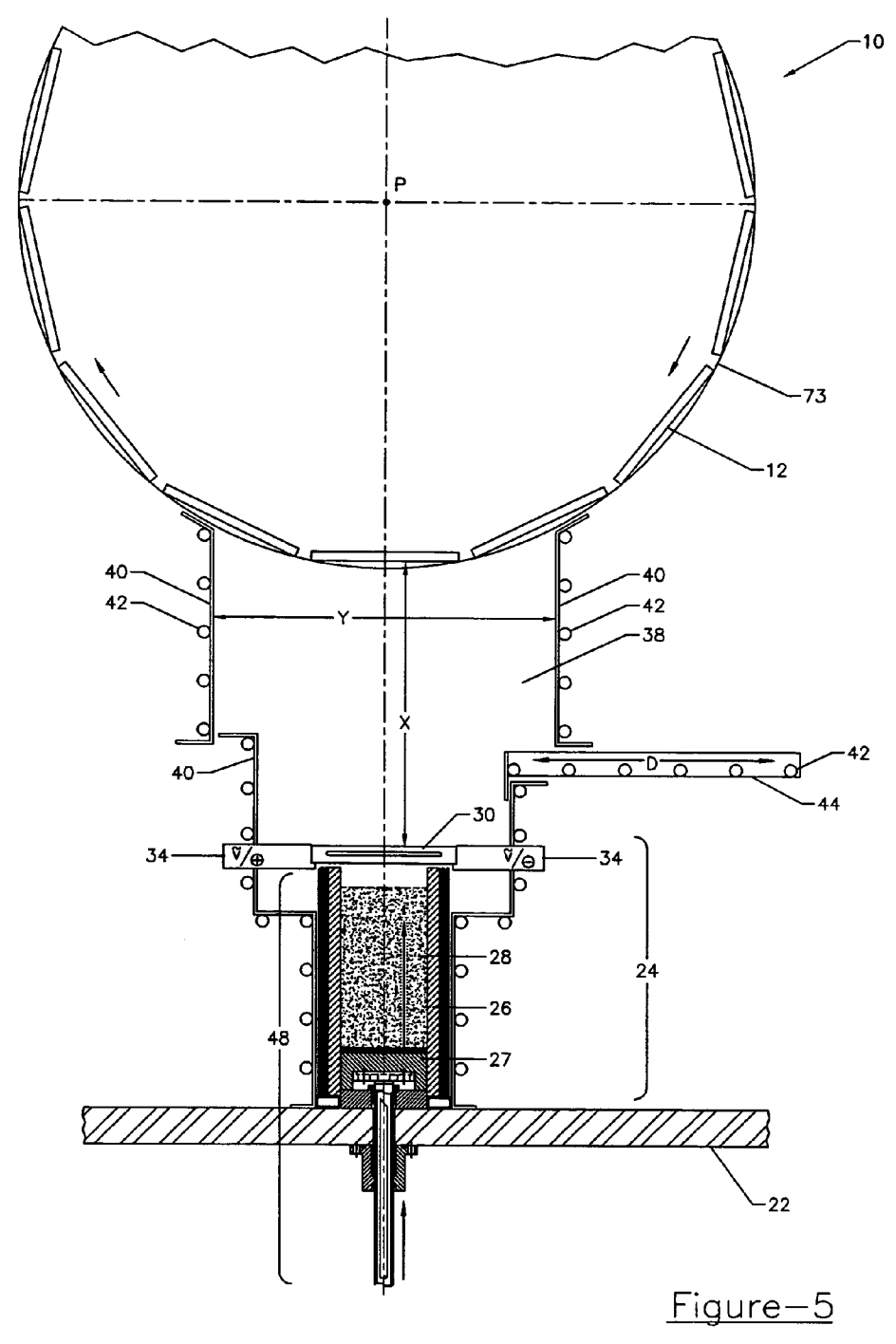

FIG. 5 illustrates an embodiment of the system 10 of the present invention wherein the process roll 16 includes or is replaced by a drum-type substrate fixture 73 for supporting a substrate 12 that includes discrete articles for batch coating thereof. The FIG. 5 embodiment of the system 10 includes the material delivery system 48 shown in FIG. 1.

Figure 6:
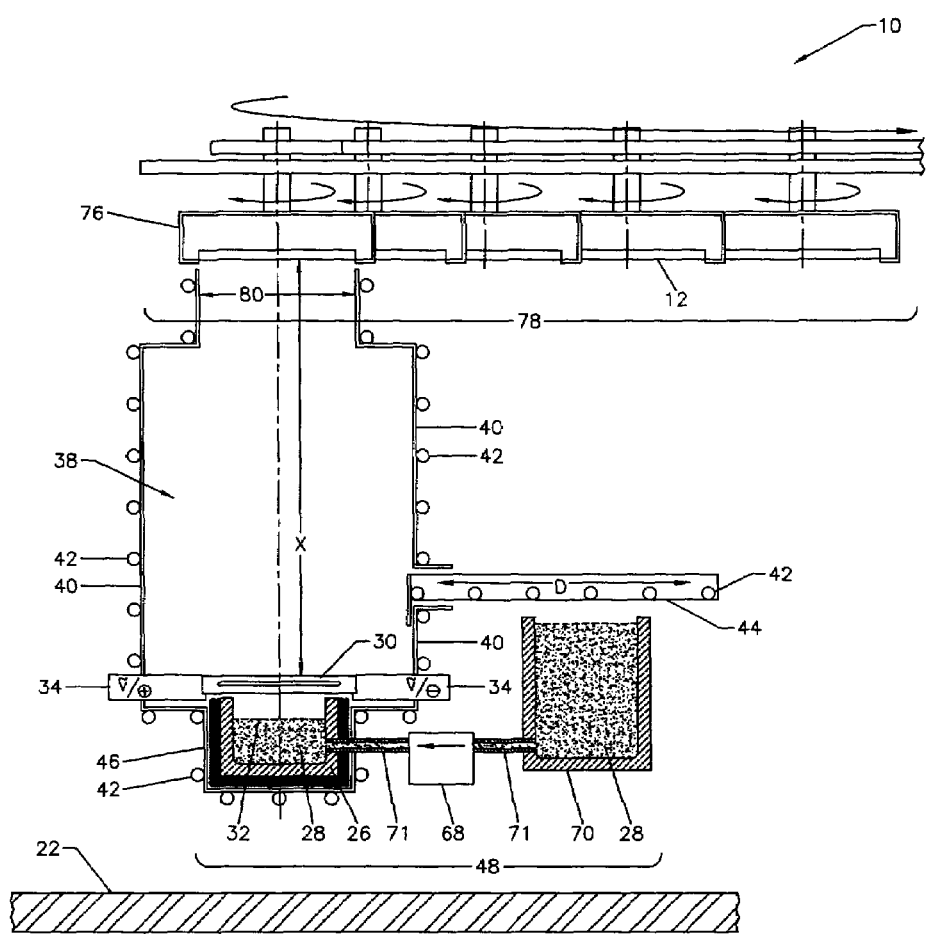
FIG. 6 is a side elevational, partly in section schematic view of the evaporator of FIG. 4 shown in a system according to the present invention for batch coating.

Referring to FIG. 6, the system 10 includes a process roll 16 having multiple substrate fixtures 76 mounted on a rotating planetary system generally designated by the reference numeral 78. The containment shields 40 include a reduced opening 80 dimensioned to correspond to the size of the substrate fixtures 76 for containing the evaporated coating material.

Figure 7:
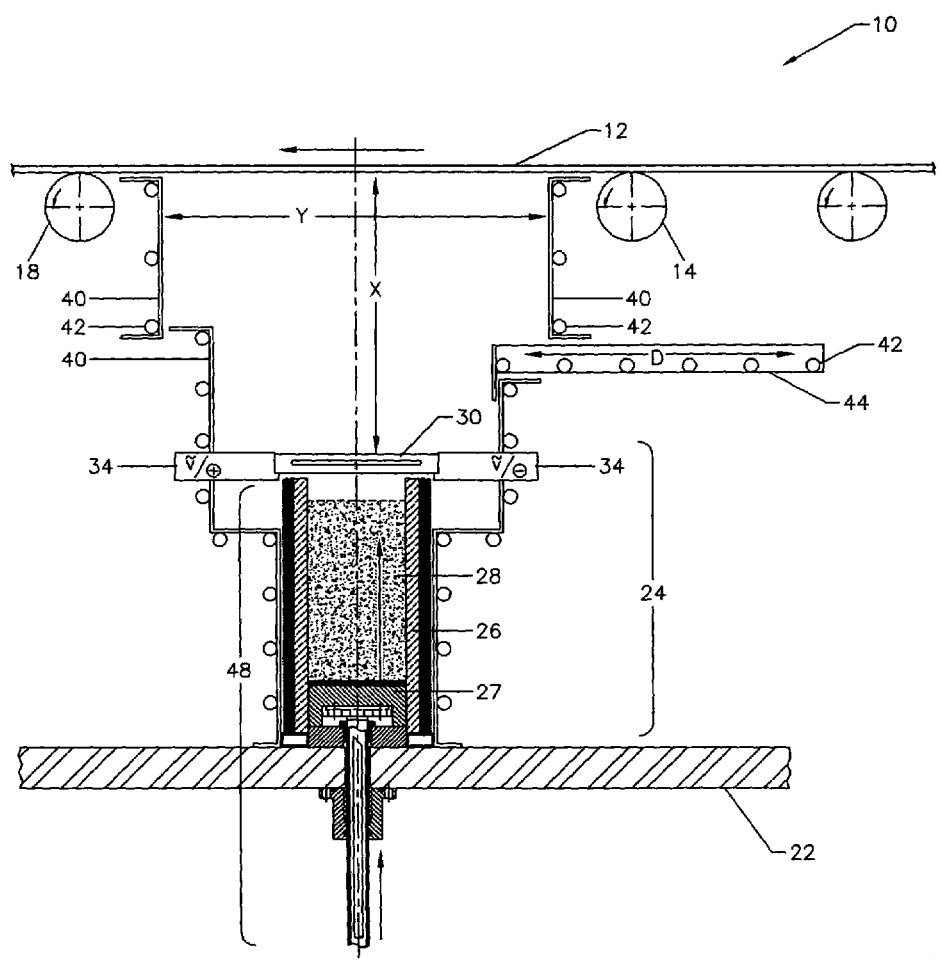
FIG. 7 is a side elevational, partly in section schematic view of the evaporator of FIG. 1 shown in a system according to the present invention for coating a plate.

FIG. 7 illustrates another embodiment of the system 10 of the present invention wherein the substrate 12 is a glass plate. The system 10 includes a delivery system for the glass plate including feeder rollers 14 and take-up rollers 18 for transport of the glass plate over the deposition zone 38.

Figure 8:
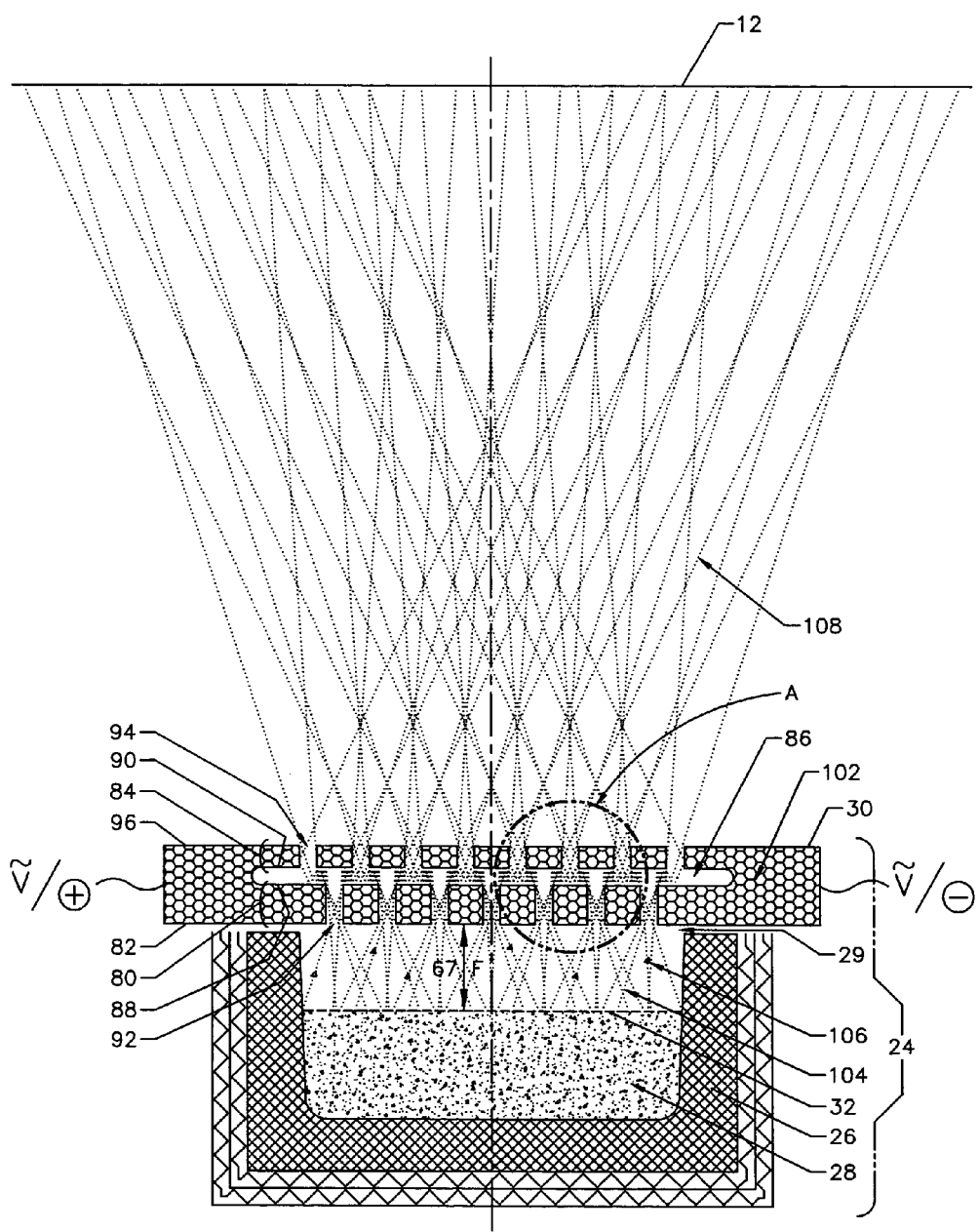
FIG. 8 is a side elevational cross-sectional view of an embodiment of a crucible and heat source according to the present invention showing an operational profile thereof including an approximation of the paths of molecules of evaporated coating material.

Referring to FIG. 8, an evaporator 24 according to the present invention includes a crucible 26 having a quantity of coating material 28 contained therein. The surface 32 of the coating material is a distance F from a heat source 30. The heat source 30 is generally planar and includes a first layer 80 positioned above the surface 32 of the coating material to be evaporated. Typically, the first layer 80 is also positioned above the crucible 26 and a generally planar lower surface 82 thereof covers at least the entire opening 29 of the crucible 26 to prevent the coating material 28 from splattering or splashing out of the crucible during an evaporation process. The heat source 30 includes a second layer 84 that is also generally planar and overlies the first layer 80 and is spaced apart therefrom.

The space defined between the first layer 80 and the second layer 84 is referred to herein as a ricochet zone 86. The ricochet zone 86 is generally defined between an upper surface 88 of the first layer 80 and a lower surface 90 of the second layer 84. The first layer 80 defines a first set of openings 92 that extend through the first layer from the lower surface 82 to the ricochet zone 86. Similarly, the second layer 84 defines a second set of openings 94 that extend through the second layer from the ricochet zone 86 through an upper surface 96 of the second layer. As shown in FIG. 8, the first set of openings 92 is not aligned with the second set of openings 94 for deflecting the path of evaporated coating material passing through the openings 92 and facilitating complete evaporation of the coating material 28 passing through the heat source 30. In other embodiments of the heat source 30 the first set of openings 92 and the second set of openings 94 are aligned and one or more baffle plates 98 (shown in FIGS. 10 and 11) each defining a further set of openings 100 are provided between the first layer 80 and the second layer 84 for deflecting the coating material 28 passing through the heat source 30. The baffle plates 98 can also be positioned above or below the first layer 80 or the second layer 84. The size, shape and any pattern in the first set of openings 92, the second set of openings 94 and the openings 100 in any baffle plate 98 are determined based on the particular evaporation process in which the heat source 30 is being used including the coating material 28 to be evaporated. Typically, the first set of openings 92 and the second set of openings 94 are drilled holes as shown in FIG. 8, however, slots or other shapes would suffice as well depending on the application.

Referring again to FIG. 8, the heat source 30 positioned above the surface 32 of the coating material 28 defines a radiant heat zone 67 wherein the heat generated by the heat source 30 causes the coating material 28 at the surface 32 to evaporate or sublimate. The sublimated coating material 28 includes individual excited molecules 104 and particles of incompletely evaporated molecules 106. The excited molecules 104 and 106 move along a mean free path as indicated by the dotted lines 108 through a first layer 84 of the heat source 30 and into the ricochet zone 86.

Figure 9:
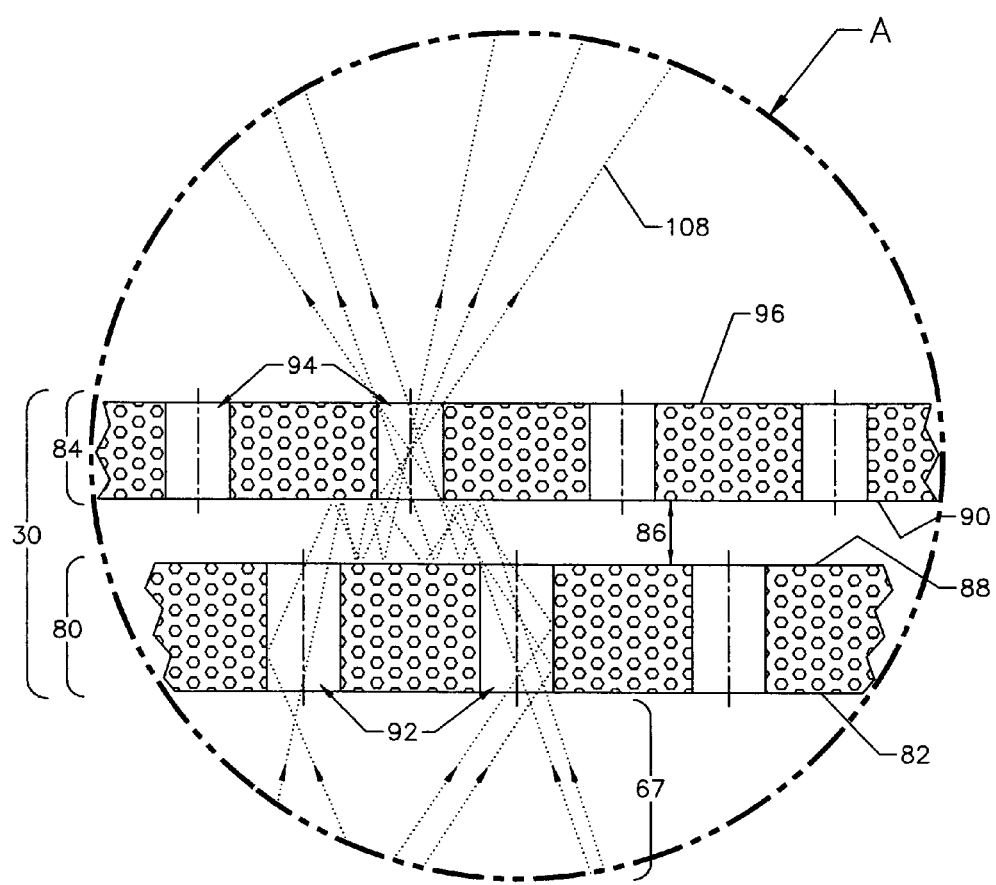
FIG. 9 is an enlarged view of the area A identified in FIG. 8.

FIG. 9 shows the area A identified in FIG. 8 in greater detail wherein the lines 108 illustrate the paths of movement of the molecules 104 and 106 through the heat source 30. As shown, the evaporated molecules 104 and 106 are deflected by the interior walls 108 of the first set of openings 92, the upper surface 88 of the first layer 80, the lower surface 90 of the second layer 84 and the interior walls of the openings 94 defined by the second layer 84 facilitating complete evaporation of any incompletely evaporated molecules 106 prior to their passing through the second layer 84 of the heat source. Because the heat source 30 includes both of the first layer 80 and second layer 84 being heated, the kinetic energy of the excited molecules 104 of coating material 28 remains high throughout their movement through the heat source 30 and the deposition zone 38. This increases the opportunity for the molecules 104 to completely evaporate and reduces the occurrence of any splattering of unevaporated particles 106 passing through the heat source 30 and engaging the substrate 12 and potentially causing damage to the surface thereof. Additionally, as shown in FIG. 9, the first set of openings 92 in the first layer 80 and the second set of openings 94 in the second layer are not aligned one with the other for causing a greater number of deflections in the paths of movement of the molecules 104 passing through the heat source 30 and increasing the amount of time the molecules 104 remain in the ricochet zone 86. This also helps to ensure complete evaporation of the molecules 104 prior to entry thereof into the deposition zone 38.

Figure 10:
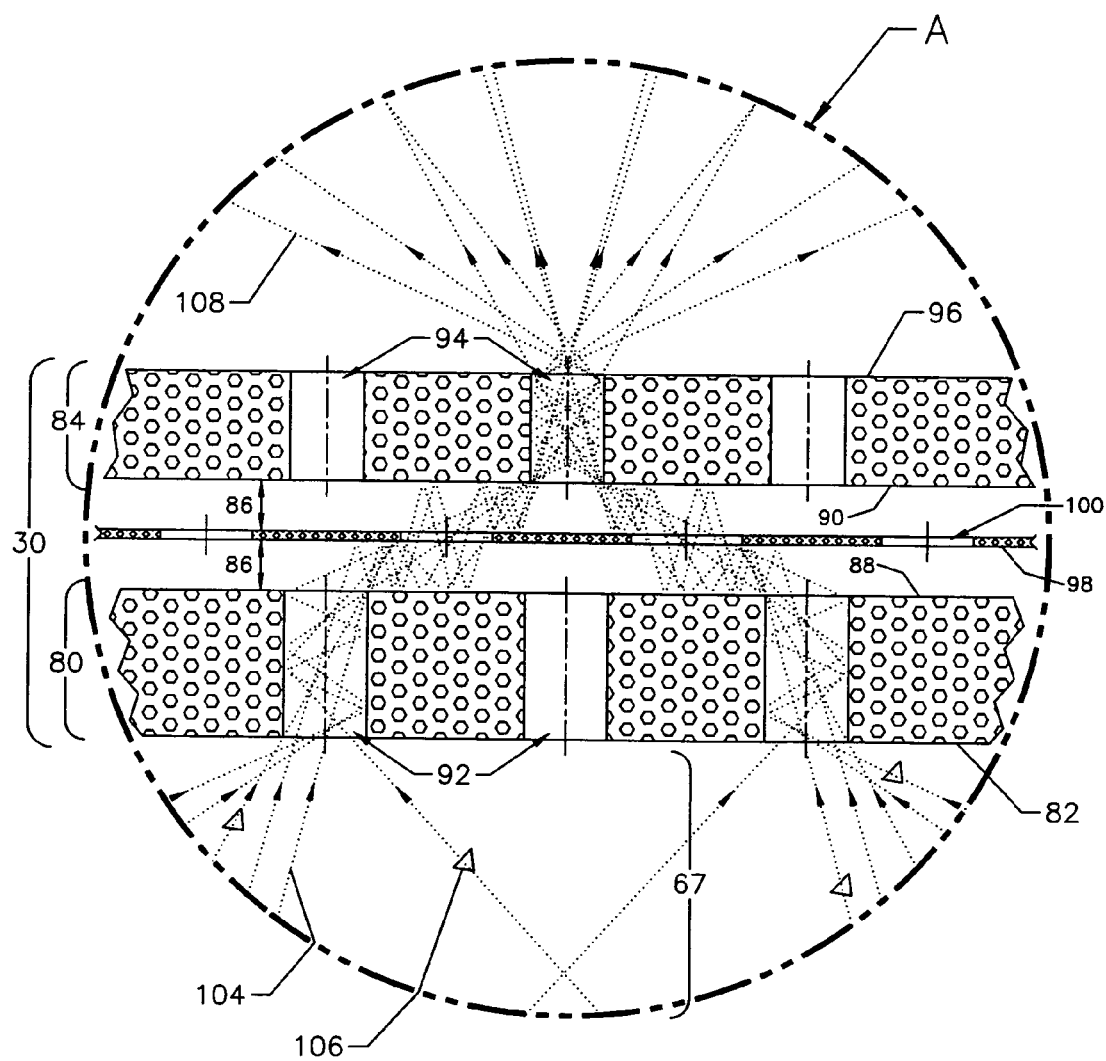
FIG. 10 is a partial, cross-sectional detailed view of an embodiment of the heat source of the present invention having a baffle plate, the figure includes an operational profile of the heat source including an approximation of the paths of molecules of evaporated coating material passing therethrough.

FIG. 10 illustrates the paths of movement 108 of molecules 104 in the ricochet zone 86 of another embodiment of a heat source 30 of the present invention. In the FIG. 10 embodiment, the heat source 30 includes a baffle plate 98 defining a set of openings 100 therein. The baffle plate 98 can be heated radiantly as shown in FIG. 10, or heated directly using a power supply coupled directly thereto. Alternatively the baffle plate 98 can be positioned to contact the heat source 30 directly wherein the electrical power coupled to the heat source will also pass through the baffle plate causing the baffle plate to heat up. Depending on the material of the baffle plate and the dimensions thereof as well as the electrical power supplied, the baffle plate will heat to a surface temperature that is known by or easily determined by one skilled in the art. As shown, the heat source 30 includes the first set of openings 92 and in the first layer 80 being aligned axially with the second set of openings 94 in the second layer 84, whereas the set of openings 100 defined by the baffle plate 98 are out of axial alignment therewith. As illustrated, the presence of the baffle plate 98 disposed between the first and second layers 80 and 84 respectively further increase the number of deflections in the paths of movement 108 of the molecules 104 as they pass through the heat source 30. Thus, in some applications, the baffle plate 98 enhances the sublimation of a coating material 28.

Figure 11:
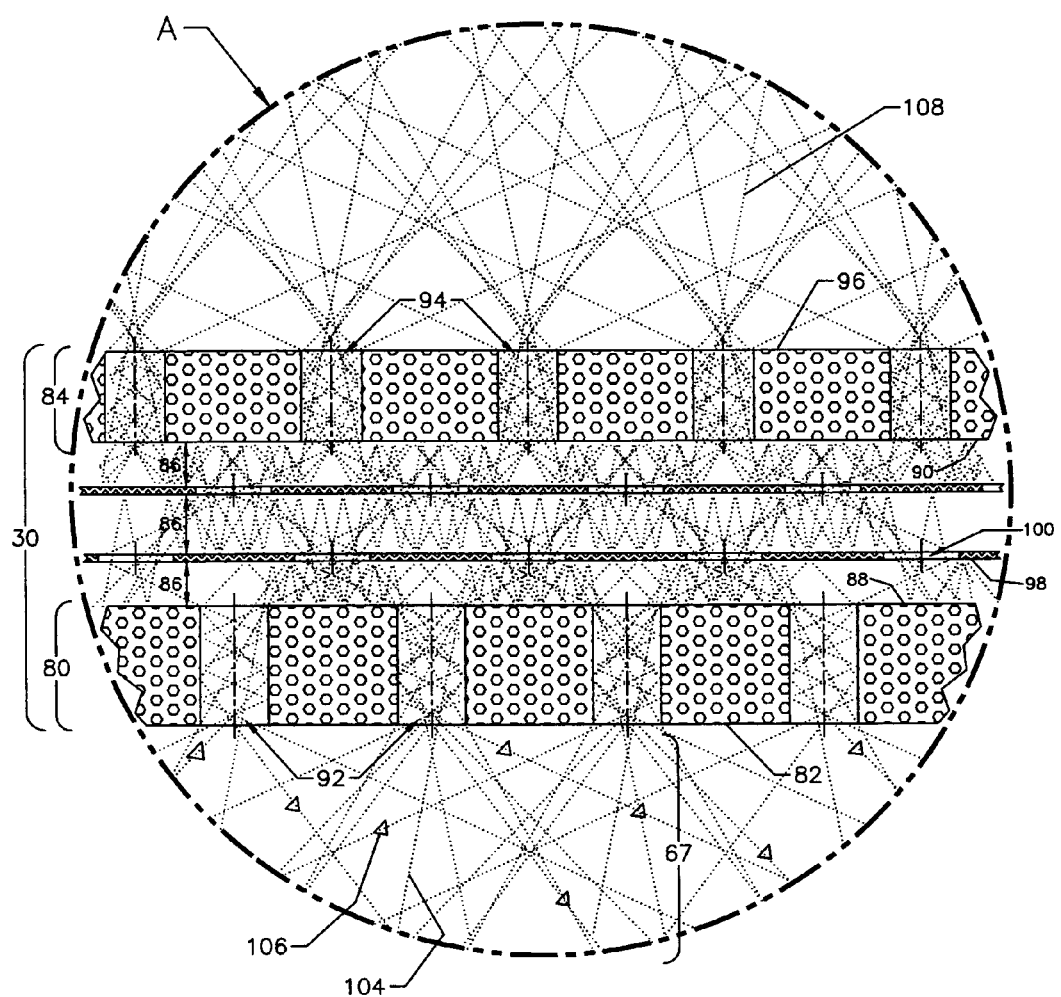
FIG. 11 is a partial, cross-sectional detailed view of an embodiment of the heat source of the present invention having two baffle plates, the figure includes an operational profile of the heat source including an approximation of the paths of molecules of evaporated coating material passing therethrough.

Referring to FIG. 11, a heat source 30 according to the present invention includes two baffle plates 98 positioned between the first layer 80 and second layer 84 of the heat source. The use of two baffle plates 98 between the first and second layers 80 and 84 of the heat source causes a still greater number of deflections in the paths 108 of the molecules 104 passing through the heat source 30. This further prolongs the period of time the molecules 104 remain in the ricochet zone 86 wherein the molecules are further heated which increases the excitation of the molecules and ensures a more uniform coating of the substrate 12.

Preferably, the heat source 30 is manufactured from a ceramic, intermetallic or composite material including one or more of graphite, aluminum oxide, aluminum nitride, boron nitride and titanium diboride. A heat source 30 uniformly fabricated from a composite of electrically conductive and non-conductive materials provides constant electrical resistance. The application of electrical current (I) through the heat source 30 at a constant voltage (V) will cause the heat source 30 to heat to surface temperatures as high as 1800° Celsius and provide a stable and long-lasting source of heat. Typically, the life of a heat source 30 according to the present invention will be between 12 to 150 hours depending on the temperatures at which it is used. Additionally, the present invention heat source 30 manufactured from ceramic and intermetallic materials can include anti-oxide and anti-nitride properties such that the heat source is not susceptible to corrosion by or reaction with coating materials 28 and/or reaction gases like nitrogen and oxygen that may occur during an evaporation process in vacuum and at high temperatures. Typical coating materials 28 include zinc sulfide and silicon oxide, however, the evaporator 24 of the present invention can also be used for heating other materials.

Figure 12:
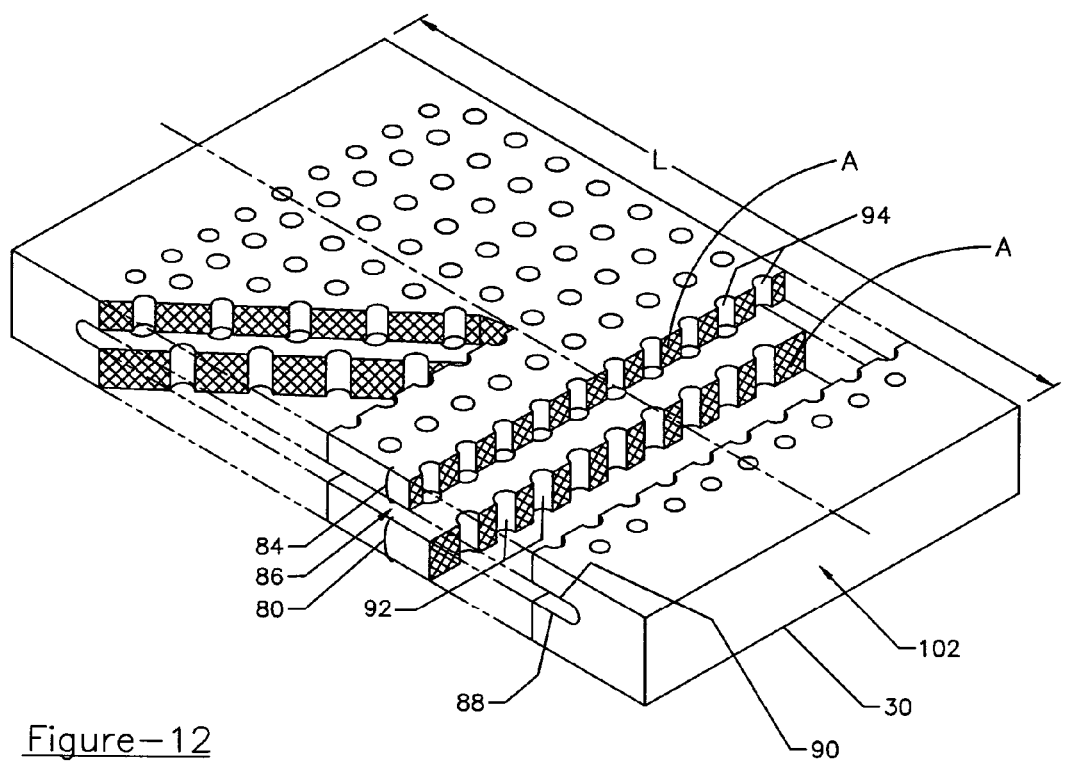
FIG. 12 is a perspective, partial cut-away view of a heat source according to the present invention.
Figure 13A:
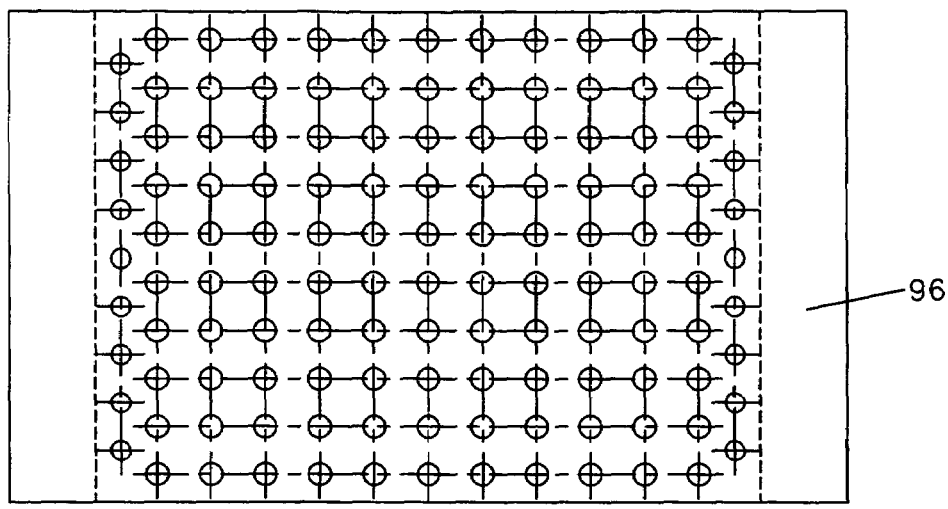
FIGS. 13A-13C are top, side and bottom views, respectively of an embodiment of a heat source according to the present invention.
Figure 13B:
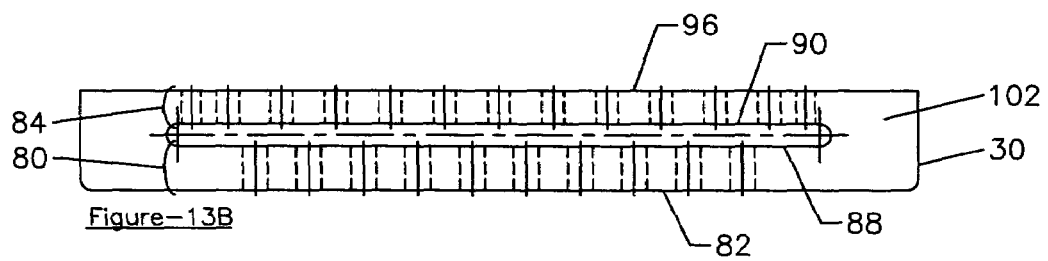
Figure 13C:
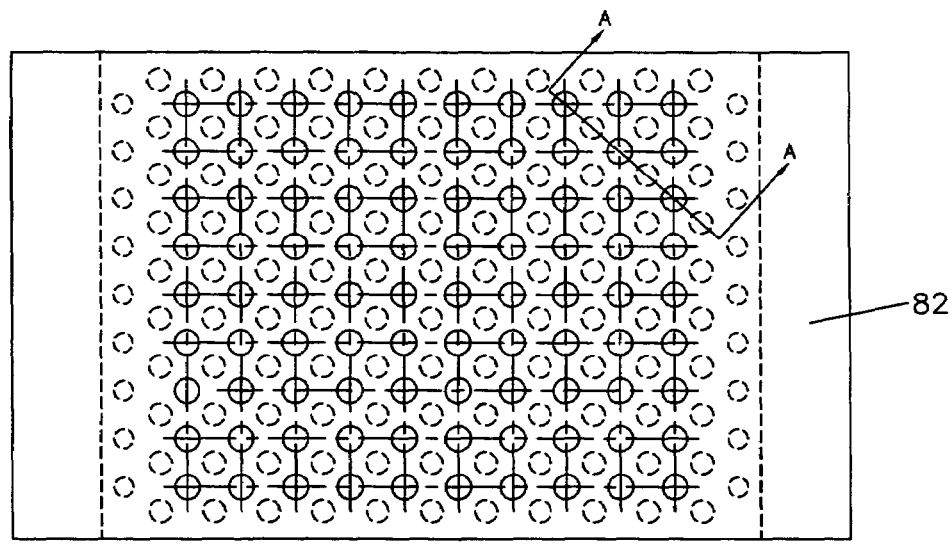
Figure 13D:
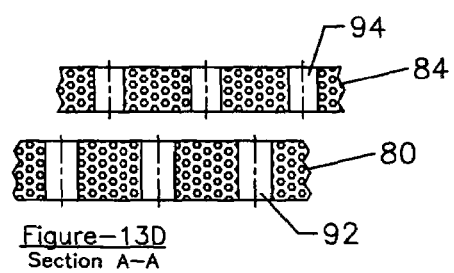
FIG. 13D is a partial cross-sectional view taken at the line A-A of FIG. 13C.
Figure 14B:
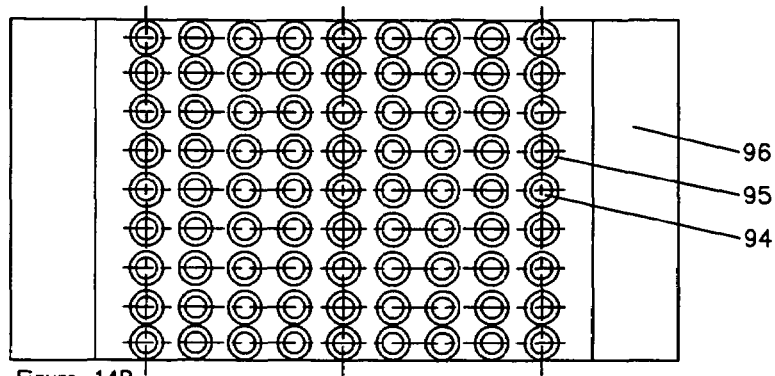
FIG. 14B is a top view of the second layer of the heat source of FIG. 14A.
Figure 14A:
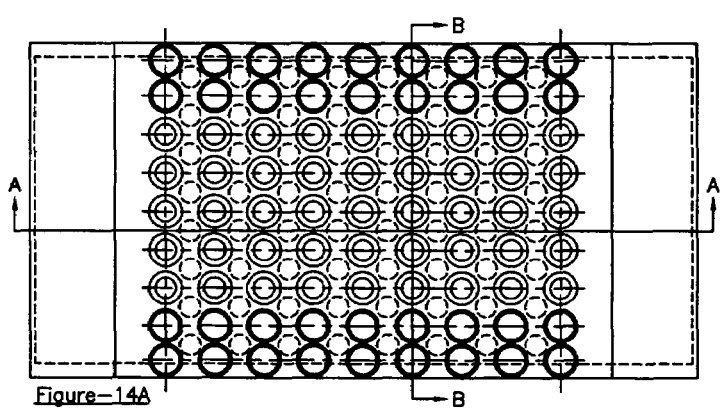
FIG. 14A is a top view of a heat source according to the present invention showing a second layer of the heat source overlying a first layer thereof.
Figure 14C:
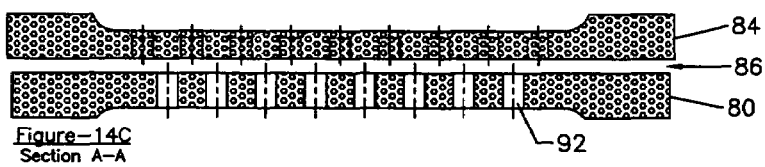
FIG. 14C is a cross-sectional view of the heat source of FIG. 14A taken at the line A-A.
Figure 14D:
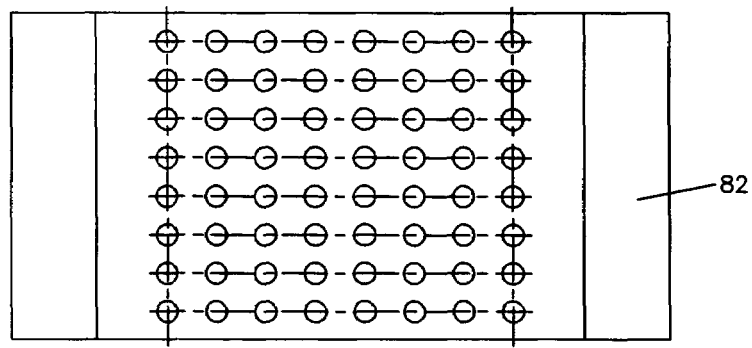
FIG. 14D is a bottom view of the first layer of the heat source of FIG. 14A.
Figure 14E:
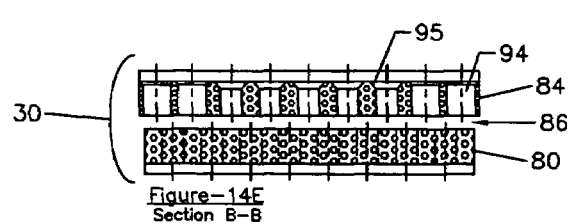
FIG. 14E is a cross-sectional view of the heat source of FIG. 14A taken at the line B-B.
Figure 15B:
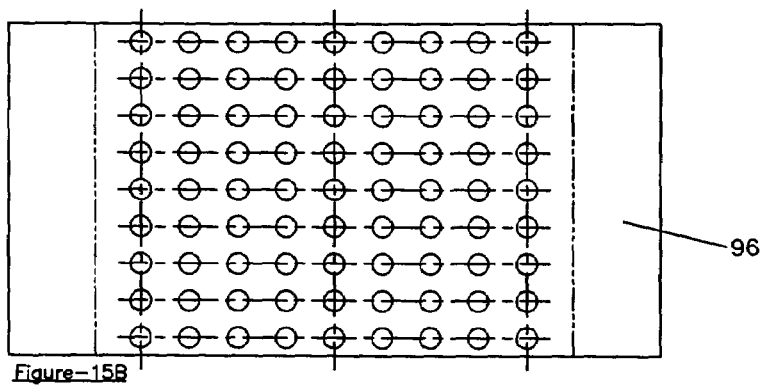
FIG. 15B is a top view of the second layer of the heat source of FIG. 15A and a bottom view of the first layer of the heat source of FIG. 15A.
Figure 15A:
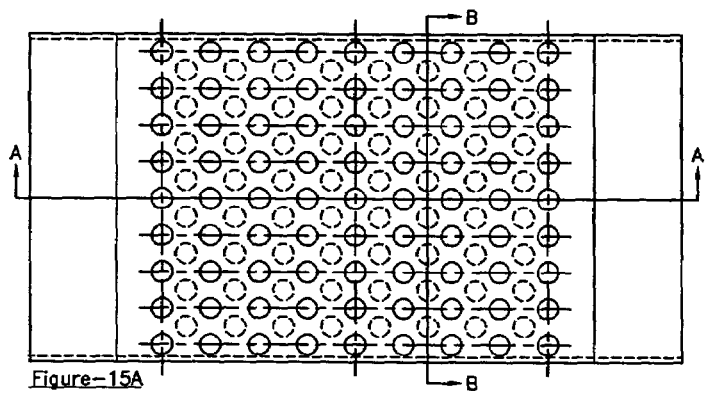
FIG. 15A is a top view of a heat source according to the present invention showing a second layer of the heat source overlying a first layer thereof and including a baffle plate disposed between the first and second layers.
Figure 15C:
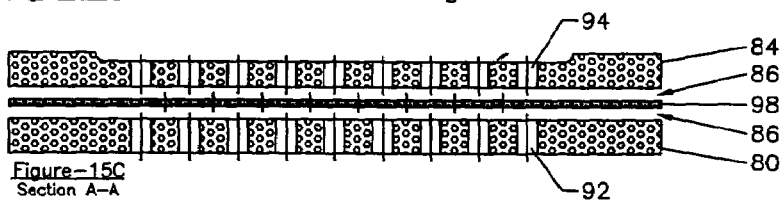
FIG. 15C is a cross-sectional view of the heat source of FIG. 15A taken at the line A-A.
Figure 15D:
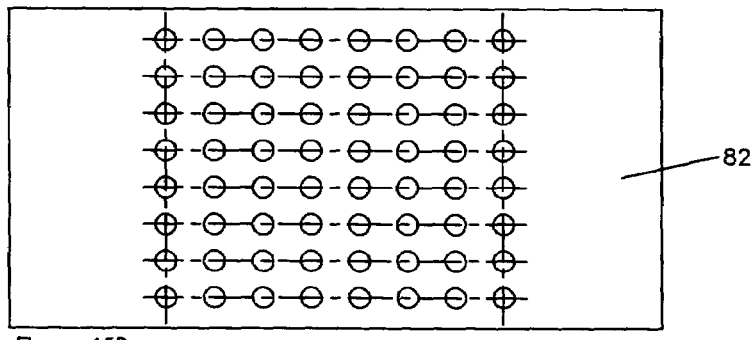
FIG. 15D is a top view of the baffle plate of the heat source of FIG. 15A.
Figure 15E:
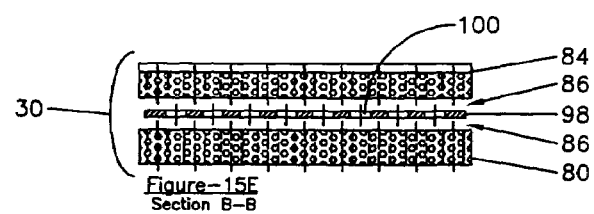
FIG. 15E is a cross-sectional view of the heat source of FIG. 15A taken at the line B-B.

Referring to FIG. 12, the heater power (surface temperature) generated by the heat source 30 is directly related to the input power, where the power (P) is equal to the input voltage (V) times the input current (I) when the length (L) and the resistance (R) of the heat source 30 are constant. The resistance R of the heat source 30 is equal to a resistivity (r) of the composite material times the length (L) divided by the cross-sectional area (A) thereof. Accordingly, the relations are as follows:

| A = Heater cross section | I = current ampere |
|---|---|
| L = Heater Length | V = Input Voltage |
| R = (r)L/A | Power (P) = V × I |
| I = V/R | |

If the electrical voltage (V), heater length (L) and composite resistivity (r) are constant, the heat cross-section will directly relate to the input power. Accordingly, when the heater cross-section, length and resistivity are constant, the surface temperature of the heat source 30 is directly related to the input voltage.

As shown in FIGS. 12 and 13, the first layer 80 and second layer 84 of the heat source 30 are formed integrally from a single piece of composite material 102. In the embodiment shown in FIG. 12, the cross-sectional areas (A) of the first layer 80 and second layer 84 are different, thus, when coupled to a common power supply 36 the first and second layers 80 and 84 respectively, will generate heat at different temperatures. However, the heat source 30 can include the first layer 80 and second layer 84 having cross-sectional areas (A) being approximately equal wherein the heat generated by each of the first layer 80 and the second layer 84 will be approximately equal. FIGS. 13A-D illustrates a heat source 30 wherein a first layer 80 is thicker than the second layer 84. Accordingly, the operating temperatures of the lower and upper surfaces 82 and 88 respectively of the first layer 80 will be different from the operating temperatures of the upper and lower surfaces 96 and 90 respectively of the second layer 84 depending on the resistivity of the composite material 102 when a power supply 36 is coupled to both of the first layer 80 and the second layer 84 for supplying electrical power thereto. FIG. 13A shows the upper surface 96 of the second layer 84 of the heat source 30 defining a pattern of circular openings 94. As shown a portion of the openings near the edges of the heat source are smaller in diameter than the openings nearer to the center of the heat source. Depending on the application, the pattern, shape, size and number of the openings 94 in the heat source 30 can vary. FIG. 13C shows the lower surface 82 of the first layer 80 of the heat source 30 shown in FIG. 13A. As best shown in FIG. 13D, the openings 92 and 94 in the first and second layers 80 and 84 respectively are not aligned one with the other.

Referring to FIGS. 14A-E, an embodiment of a heat source 30 is shown having a first layer 80 and second layer 84 formed from separate pieces of composite material. In this embodiment, the temperature of the first and second layers 80 and 84 respectively can be independently controlled using a separate power supply 36 for each of the layers. Thus, the first and second layers 80 and 84 respectively having equal dimensions can be operated at different temperatures. The control system 20 can be coupled to each of the separate power supplies 36 providing independent control of the electrical power delivered to each of the layers 80, 84. Additionally, the second layer 84 includes openings 94 having flared surfaces 95 defined by the upper surface 96 for allowing greater dispersion of the evaporated coating material 28 passing through the second layer of the heat source 30.

Referring to FIGS. 15A-E, a heat source 30 according to the present invention is shown having a baffle plate 98 disposed between the first layer 80 and second layer 84 of the heat source. The second layer 84 overlies the first layer 80 and defines a second set of openings 94 which are aligned with the first set of openings 92 defined by the first layer. The openings 100 defined by the baffle plate 98 are offset with respect to the first set of openings 92 and the second set of openings 94 for deflecting the paths of the evaporated coating material passing through the heat source 30.

FIGS. 16A-E illustrate another embodiment of a heat source 30 according to the present invention having slotted openings 92 and 94 in a first layer 80 and second layer 84 respectively. In this embodiment, each of the first layer 80 and the second layer 84 of the heat source 30 is formed from multiple segments 85 of a composite material 102 positioned adjacent one another. Although, the heat source 30 has been described having a first layer 80 and a second layer 84, the present invention is not limited in this regard as the heat source 30 can include any number of layers in a stacked arrangement, including a single layer.

Referring again to FIG. 1, the system 10 of the present invention can include multiple sensors or monitors coupled to the controller 20 for use in monitoring and controlling an evaporation process and the coating of a substrate 12. In particular, the system 10 includes an optical sensor or crystal monitor 111 for measuring the thickness of the coating material 28 deposited on the substrate 12. Preferably, the monitor 111 is positioned to monitor the substrate 12 during or just after a coating process. The optical sensor 111 is coupled to the controller 20 wherein signals or data received from the optical sensor are processed for use in controlling an evaporation process. In addition to utilizing the signals received from the optical sensor 111 for controlling a coating process, the controller 20 can display or generate reports that include the actual coating thickness that is deposited on the substrate at a predetermined intervals, e.g. every 30 feet for a continuous web substrate.

Additionally, the system 10 includes a line speed monitor 113 that is also coupled to the controller 20 for monitoring the line speed of the process roll 16. The controller 20 controls the line speed of the process roll 16 by adjusting the speed of the substrate driver (not shown). The system 10 also includes multiple temperature gauges 115 that are coupled to the controller 20 for monitoring the temperatures of the first and second layers 80 and 84 respectively of the heat source 30, the temperature in the deposition zone 38 and the temperature of the radiant heat zone 67 between the heat source 30 and the surface 32 of the coating material 28 in the crucible 26. A material feed sensor 117 coupled to the controller 20 monitors the feed rate of the material delivery system 48 for monitoring the movement of the coating material 28 in the crucible 26. Alternatively, the driver powering the movable sidewall 27 of the crucible 26 can be controlled to feed the coating material 28 at a pre-determined rate depending on a depletion rate thereof. In this embodiment of the system 10, once an evaporation process begins, the coating material 28 is continuously moved at a constant rate toward the opening 29 in the crucible 26 in the G direction via the movable sidewall 27 and the driver therefor throughout an evaporation process. A shutter position sensor 119 coupled to the controller 20 monitors the position of the shutter mechanism 44 relative to the deposition zone 38 for use in opening or closing the shutter mechanism.

The controller 20 is programmed to utilize signals or data received from one or more of the above-identified sensors to monitor and control an evaporation process including monitoring and controlling the thickness and quality of the coating applied to the substrate 12. The controller 20 can also be programmed to display or report various parameters of an evaporation process for operator control or monitoring of the system 10.

In operation of the system 10, the substrate 12 to be coated is identified as well as the desired specifications for of the coating material 28 to be deposited on the substrate and the thickness of the coating (usually measured in Angstroms). Using the desired specifications for the coating and the coating material 28, an appropriate sized deposition zone is determined as well as evaporation parameters for the particular coating material 28.

The controller 20 can be programmed and utilized for determining optimal evaporation parameters for a desired evaporation process and a specified coating material 28. The evaporation parameters for the system 10 include an optimal operating temperature for the heat source 30 including the voltage and current necessary to generate the appropriate temperature necessary for evaporating a specified coating material 28. To maintain a constant temperature at the surface 32 of the coating material 28 in the crucible 26, the controller 20 adjusts the voltage output of the power supply 36 which will affect the current through the heat source 30 and result in a temperature change on the surfaces thereof. Updated signals sent from temperature gauges 115 to the controller 20 provide closed loop control of the heat source 30.

The controller 20 also determines and stores an optimal feed rate for the material delivery system 48 for controlling the movement of the coating material 28 in the crucible 26. As long as the temperature of the heat source 30 is stable and a coating process is ongoing, the feed rate of the coating material 28 in the crucible 26 can be kept constant until a coating process is completed. The feed rate of the material in the crucible is monitored by the controller using signals received from the material feed sensor 117. Alternatively, the material delivery system 48 can be controlled to feed the material in the crucible 26 at a constant predetermined rate throughout an evaporation process. An optimal feed rate for the material delivery system 48 is determined by taking into consideration the type and form of the coating material 28, a solid (powder, granular, wire, pellet, slug or ingot) or liquid and the evaporation rate of thereof. (i.e. 28,000 angstroms per second). The controller 20 is programmed to maintain predetermined evaporation parameters throughout a coating process. Additionally, the system can include alarms for notifying an operator of unacceptable conditions in the performance of the components of the system or the coatings produced thereby.

The present invention also includes a method of evaporating a coating material for coating a substrate in a high vacuum environment. The method includes the steps of:

depositing a quantity of coating material to be evaporated in a heating crucible;

placing a heat source above a surface of the coating material in the crucible for vaporizing the coating material at the surface;

heating the surface of the quantity of coating material to a predetermined temperature for evaporating the coating material at the surface;

confining the vaporized coating material in a deposition zone;

moving a substrate through the deposition zone for coating the substrate with the evaporated coating material from the crucible; and enveloping the heating crucible, the heat source and the deposition zone in a high vacuum chamber for evaporating and depositing the coating material on a substrate in a high vacuum environment.

Additionally, the method of evaporating a coating material can include during heating of the coating material, maintaining an approximately constant distance between a surface of a heat source and the surface of the coating material in the crucible. The surface of the coating material in the crucible can be maintained a constant level by reducing the capacity of the heating crucible according to a rate of depletion of the quantity of coating material in the heating crucible. Alternatively, the surface of the coating material in the crucible can be maintained constant by replenishing the quantity of coating material in the crucible according to a rate of depletion thereof.

Further, the method of the present invention of evaporating a coating material can include heating both first and second layers of a heat source either together or independently wherein the heat sources are heated to different temperatures. Alternatively, the first and second layers can be electrically heated to different temperatures using a common power source by providing the first and second layers with different dimensions or different electrical resistivities.

The method of the present invention of evaporating a coating material and coating a substrate also includes providing openings in the heat source for the evaporated coating material to pass therethrough including providing a first set of openings in a first layer of the heat source and a second set of openings in a second layer of the heat source wherein the second layer overlies the first layer and the first and second sets of openings are out of alignment with respect to each other. Thus, the first and second sets of openings causing deflecting of the path of the vaporized coating material between first and second layers of a heat source for facilitating complete evaporation of the coating material passing through the heat source.

Additionally, the present invention method of evaporating a coating material and coating a substrate therewith includes monitoring a coating process including at least one of monitoring a feed rate of the substrate through the deposition zone, monitoring the temperature of a surface of the heat source, monitoring the temperature of the deposition zone, monitoring the temperature of a radiant heat zone between a lower surface of the heat source and the surface of the coating material in the crucible and monitoring the thickness of the coating on the substrate.

The method further including adjusting at least one of the temperature of the heat source, the feed rate of the substrate through the deposition zone and the rate of movement of the material in a crucible, in response to results generated by the steps of monitoring of a coating process.

The foregoing description of embodiments of the invention has been presented for the purpose of illustration and description, it is not intended to be exhaustive or to limit the invention to the form disclosed. Obvious modifications and variations are possible in light of the above disclosure. The embodiments described were chosen to best illustrate the principals of the invention and practical applications thereof to enable one of ordinary skill in the art to utilize the invention in various embodiments and with various modifications as suited to the particular use contemplated. It is intended that the scope of the invention be defined by the claims appended hereto.

What is claimed is:

1. An evaporator for evaporating materials for use in a coating process comprising:
    a heating crucible for containing a coating material to be evaporated;
    a generally planar heat source disposed so as to heat a surface of the coating material in the heating crucible, the heat source including a first layer defining a first set of openings for the evaporated material to pass through and a second layer defining a second set of openings for the evaporated material to pass through, the first layer spaced apart from the second layer; and
    the heating crucible further comprising a movable sidewall, the sidewall being movable during an evaporation process for varying the capacity of the heating crucible and maintaining a constant distance between the surface of the coating material being evaporated and the heat source.

2. The evaporator of claim 1 wherein the heat source comprises a ceramic material.

3. The evaporator of claim 1 wherein the heat source comprises an intermetallic material.

4. The evaporator of claim 1 wherein the heat source comprises a material selected from the group consisting of graphite, aluminum oxide, aluminum nitride, boron nitride and titanium diboride.

5. The evaporator of claim 1 wherein the heat source is disposed above the heating crucible.

6. The evaporator of claim 1 further comprising a driver coupled to the movable sidewall for moving the movable sidewall.

7. The evaporator of claim 6 further comprising a controller for controlling an evaporation process wherein the driver for controlling the movement of the movable sidewall is coupled to and controlled by the controller.

8. The evaporator of claim 1 further comprising a power supply coupled to the heat source and providing an electrical current therethrough for heating the heat source.

9. The evaporator of claim 1 wherein the first and second layers of the heat source comprise electrical heaters, a first power supply is coupled to the first layer of the heat source and provides an electrical current therethrough for heating the first layer, a second power supply is coupled to the second layer of the heat source and provides an electrical current therethrough for heating the second layer, wherein the first and second power supplies provide independent control of the temperatures of the first and second layers of the heat source respectively.

10. An evaporator for evaporating materials for use in a coating process comprising:
    a heating crucible for containing a coating material to be evaporated;
    a generally planar heat source disposed so as to heat a surface of the coating material in the heating crucible, the heat source including a first layer defining a first set of openings for the evaporated material to pass through and a second layer defining a second set of openings for the evaporated material to pass through, the first layer spaced apart from the second layer; and wherein
    the first and second layers of the heat source are positioned in an overlying relationship, the first set of openings being out of alignment with the second set of openings for causing deflection of heated and vaporized coating material passing through the heat source for facilitating complete evaporation thereof.

11. The evaporator of claim 10 wherein at least a portion of the first set of openings and the second set of openings are circular.

12. The evaporator of claim 10 wherein at least a portion of the first set of openings and the second set of openings are slots.

13. The evaporator of claim 10 further comprising an auxiliary crucible connected in fluid communication with the heating crucible for containing a supply of a coating material and maintaining a constant volume of a coating material in the heating crucible.

14. The evaporator of claim 13 further comprising transfer means in fluid communication with the heating crucible and the auxiliary crucible for transferring coating material therebetween.

15. The evaporator of claim 10 further comprising a high vacuum chamber wherein the heating crucible and the heat source are disposed in the high vacuum chamber.

16. An evaporator for evaporating materials for use in a coating process comprising:
    a heating crucible for containing a coating material to be evaporated;
    a generally planar heat source disposed so as to heat a surface of the coating material in the heating crucible, the heat source including a first layer defining a first set of openings for the evaporated material to pass through and a second layer defining a second set of openings for the evaporated material to pass through, the first layer spaced apart from the second layer; and
    a baffle plate disposed between the first layer and the second layer of the heat source, the baffle plate defining openings therein, the openings in the baffle plate being out of alignment with at least one of the first set of openings and the second set of openings for deflecting coating material passing therethrough.

* * * * *